Jan. 6, 1970 J. H. STAUDTE 3,488,530

PIEZOELECTRIC MICRORESONATOR

Filed April 22, 1968

INVENTOR.
JUERGEN H. STAUDTE

BY Howard A. Silber

ATTORNEY

United States Patent Office 3,488,530

Patented Jan. 6, 1970

3,488,530
PIEZOELECTRIC MICRORESONATOR

Juergen H. Staudte, Tustin, Calif., assignor to North American Rockwell Corporation Filed Apr. 22, 1968, Ser. No. 722,914
Int. Cl. H01v 7/00; H03h 9/00
U.S. Cl. 310—9.1 18 Claims

ABSTRACT OF THE DISCLOSURE

A piezoelectric resonator adapted for microelectronic application. In a preferred embodiment, the resonator comprises a piezoelectric beam adapted to vibrate in the free-free flexure mode, and having support arms extending perpendicularly from nodal points thereof. The extremities of the arms are supported above a microelectric substrate by means of metal pedestals, which pedestals also provide electrical connection to a pair of closed-spaced, parallel thin film metal electrodes disposed longitudinally on one surface of the beam. Application of a signal across the electrodes provides an electric field gradient within the beam resulting in piezoelectric stress components appropriate to initiate flexural vibration.

BACKGROUND OF THE INVENTION

Field of the invention

The present invention relates to a piezoelectric resonator adapted for incorporation in a microelectronics circuit.

Description of the prior art

While an increasing variety of microelectronic components have become available in the last few years, the integrated circuit designer is still handicapped by the fast that inductors cannot be fabricated with sufficiently small size to permit their incorporation in a typical microelectronic integrated circuit. Thus, should the designer require a resonate circuit, various artifacts must be resorted to as a substitute for a resonant circuit. For example, free-running multivibrators have been made to serve as oscillators, the frequency being determined by capacitors and resistors, components which can be fabricated microelectronically. Of course, the frequency stability achievable with such circuits is inferior to that obtainable with a high Q resonant circuit. Alternatively, microelectronic digital filters have been employed in some instances despite the fact that such filters require a considerable number of components.

While mechanical filters having very high Q are available commercially, they are of such a size (typically more than one inch long) as to preclude their incorporation in integrated circuits. Such mechanical filters typically comprise a first transducer to convert an electrical signal into transverse mechanical oscillation of a first mechanically resonant metal disc, a plurality of concentrically oriented, spaced resonant metal discs coupled to one another by rods at their periphery, and a second transducer to convert the induced mechanical motion of another of the resonant metal discs to an output electrical signal.

A prior art approach to the incorporation of a mechanically resonant element into a microelectronic circuit is the electrostatically driven, cantilevered mechanical beam developed by Nathanson, Newell, Wickstrom, and Davis (see "The Resonant Gate Transistor," IEEE Transactions On Electronic Devices, volume ed–14, No. 3, Mar. 19, 1967, beginning at page 117). In this device, a metal beam supported at one end is suspended over the surface of a microelectronic substrate. A field effect transistor (FET) is fabricated within the substrate, beneath the beam, such that mechanical flexure in the clamped-free mode of the cantilevered metal beam modulates the source-to-drain current within the FET. The beam is driven electrostatically by applying an input signal between the beam and a metal input plate disposed on the substrate beneath the beam.

The resonant gate transistor device is of limited practical value because the mechanical resonator is fabricated as an electroplated metal beam resonating in the clamped-free flexure mode. Because of poor reproducibility of the quality of the metal film, the thickness of the film, and the boundary conditions of the clamped beam, the frequency of the device cannot accurately be predicted. Also, such a beam operated in the clamped-free mode has an inherently low Q because of loss of energy through the clamped boundary. Moreover, the drive is electrostatic and, therefore, nonlinear. If linearized by application of a large bias voltage the frequency becomes voltage sensitive and stability problems occur.

These and other limitations of the prior art may be overcome by utilizing the inventive piezoelectric microresonator. Utilizing a quartz beam vibrating in the free-free flexure mode, the device has inherently high Q, reproducible frequency characteristics; a unique mounting technique permits the inventive device readily to be incorporated in a microelectronic circuit.

SUMMARY OF THE INVENTION

In accordance with the present invention there is provided a pieoelectric micro-resonator comprising a beam of quartz or the like, cut in an appropriate plane so as to produce longitudinal stress in response to a transversely applied electric field. The beam is integrally provided with support arms extending perpendicular to the beam from the free-free flexure mode nodal points. The resonator beam is supported above a microelectronic substrate by metal pedestals located at the extremities of the support arms.

A pair of parallel, thin film electrodes extend longitudinally on one surface of the beam. When an electrical signal is applied across the electrodes, the resultant electric field within an transverse of the beam produces a longitudinal stress in the beam. Because there is an electric field gradient across the thickness of the beam, a corresponding stress gradient results across the beam, causing flexural motion of the beam. Oscillation of the beam is in the free-free flexure mode.

A second pair of parallel, thin film longitudinal, electrodes may be provided on the beam. An electric field will be generated across these second electrodes in response to the stress resulting within the beam upon flexure at the beam mechanical resonant frequency. This permits the structure to be used as a filter, the input signal being used to drive the micro-resonator, the output signal being derived from the electric field generated across the second set of electrodes.

In an alternative embodiment, two or more parallel beams may be fabricated from the same quartz wafer, interconnected by bridges at the free-free flexure nodal points. The entire multi-beam resonant structure is supported by arms extending perpendicular to the beams from the nodal points, the extremities of the arms being mounted on pedestals extending from a mircroelectronic substrate. A pair of parallel, longitudinal, thin film electrodes on one of the beams receives an input signal; oscillation of this beam in the free-free flexure mode ensues, the mechanical motion is coupled via the bridges to the other beams, and an output is generated across a second pair of thin film metal electrodes disposed longitudinally on another of the beams. By selecting the mechanical resonant frequencies of the beams to be slightly different from one another, a broad passband filter may be achieved having, if desired, substantially flat response characteristics.

Thus, it is an object of the present invention to provide a resonant element adapted for incorporation in microelectronic circuit.

Another object of the present invention is to provide a piezoelectric micro-resonator.

It is another object of the present invention to provide a piezoelectric resonator operable in the free-free flexure mode.

Yet another object of the present invention is to provide a high Q piezoelectric resonator, operable in the free-free flexure mode, and adapted for incorporation in a microelectronic circuit.

A further object of the present invention is to provide a microelectronic mechanical filter.

Still a further object of the present invention is to provide a broadband mechanical filter incorporating a plurality of coupled piezoelectric beam resonators, each operable in the free-free flexure mode.

BRIEF DESCRIPTION OF THE DRAWINGS

These and other objects of the invention will become apparent from the following description taken in connection with the accompanying drawings, in which.

DESCRIPTION OF THE PREFERRED EMBODIMENTS

Figure 1:
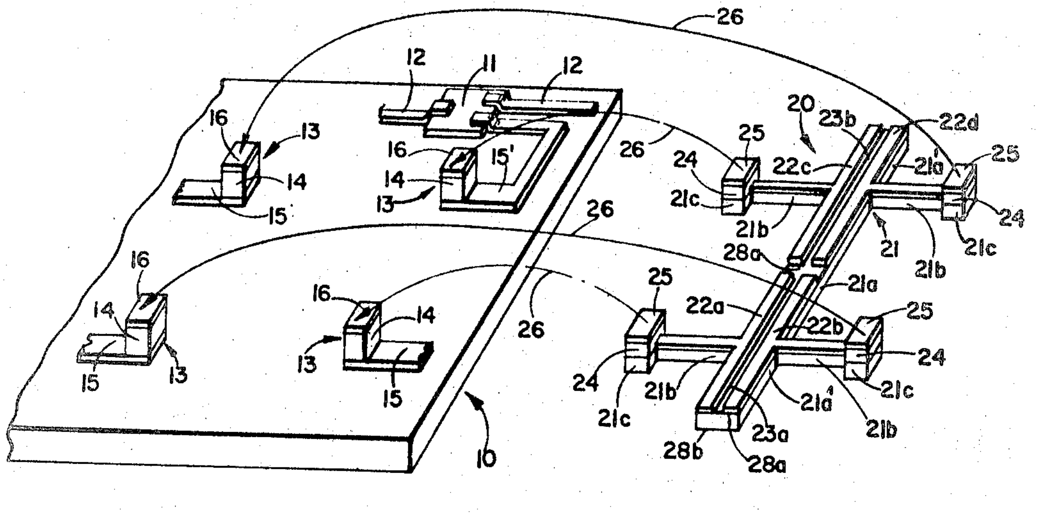
FIGURE 1 is a greatly enlarged perspective view of a piezoelectric microresonator in accordance with the present invention, and adapted for incorporation in an integrated circuit. The figure also shows a typical microelectronic substrate including pedestals for mounting of the resonator.

Referring now to the drawings and more particularly to FIGURE 1 thereof, there is seen a substrate 10 for a microelectronic integrated circuit. Typically, substrate 10 may comprise a semiconductor such as silicon, germanium, gallium arsenide or the like, in which active and passive components have been fabricated by diffusion and other techniques well known in the integrated circuit art. Alternatively, substrate 10 may comprise an electrically insulating substrate such as sapphire, BeO or the like, on which substrate epitaxial islands of semiconductor material may be disposed. Island 11 is typical of such epitaxial semiconductor islands. Electrically isolated active and/or passive components may be provided (using techniques well known in the microelectronic art) on semiconductor island 11, and such components being interconnected with other components on substrate 12 by means of plurality of thin film metal conductors 12. Alternatively, substrate 10 may comprise a material such as quartz, the microresonator supported thereon being adapted for electric connection in a circuit fabricated external to substrate 10.

As illustrated in FIGURE 1, substrate 10 is provided with four pedestals 13 adapted to support, and to provide electrical interconnection to a piezoelectric microresonator in accordance with the present invention. Each of pedestals 13 includes a metallic support portion 14 disposed atop a respective thin film electrical conductor 15. Conductors 15 provide electrical connection to the circuit in which the inventive microresonator is to be used. For example, conductor 15' is illustrated as being interconnected to the electronic components fabricated in semiconductor island 11. Typically, conductors 15 may be on the order of 3,000 angstroms thick, often of gold, aluminum or the like, while support portions 14 may be of the same or different metal, and typically may have a thickness on the order of 4 microns. Of course, the thicknesses of conductors 15 and support portions 14 is not critical.

Disposed atop support portions 14 of each of pedestals 13 is a layer 16 of an electrically conductive eutectic material. Typically, layer 16 may comprise a eutectic of aluminum-gold, tin-lead (solder) or other eutectics known to those skilled in the art and having melting points below the temperature at which degradation of electronic componets fabricated on substrate 10 occurs.

A typical piezoelectronic micro-resonator 20 in accordance with the present invention also is shown in FIGURE 1; for clarity, microresonator 20 is illustrated unmounted. Microresonator 20 comprises a unitary thin wafe 21 of piezoelectric material such as quartz, cadmium sulfide or the like. Wafer 21 is fashioned to include an elongate beam portion **21*a* having four cantilevered support arms 21*b*. Note that beam 21*a* extends beyond support arms 21*b*, as indicated by the projecting portions 21*a'*. Arms 21*b* terminate in enlarged regions 21*c***.

Still referring to FIGURE 1, disposed on one surface **23*a* of piezoelectric wafer 21 are four thin film metallic electrodes 22*a*, 22*b*, 22*c* and 22*d*. It will be appreciated that electrodes 22*b* are extremely thin, typically on the order of 1,000 angstroms, much thinner than the thickness of piezoelectric wafer 21, which may have a thickness on the order of 1 mil. Note that electrodes 22*a* and 22*b* extend longitudinally along beam 21*a*, parallel to the edges thereof, and that a narrow gap 23*a* exists between parallel edges of electrodes 22*a* and 22*b*. Similarly, electrodes 22*c* and 22*d* extend longitudinally of beam 21, are parallel, and spaced apart by a gap 23*b*. Electrodes 22*a*, 22*b*, 22*c*, and 22*d* respectively are connected to metallic support members 24 disposed atop enlarged regions 21*c* at the ends of arms 21*b*. A layer 25 of eutectic material is provided atop each of support member 24**.

Figure 2:
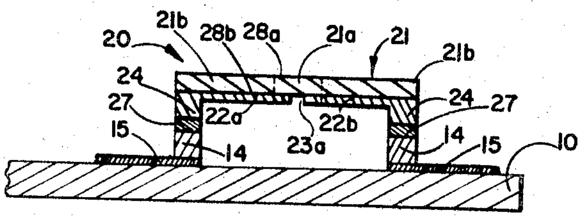
FIGURE 2 is a sectional view of the piezoelectric microresonator of FIGURE 1, shown mounted on the microelectronic substrate. The view is as would be seen generally along lines 2—2 of FIGURE 1.

As illustrated by arrows 26 in FIGURE 1, inventive piezoelectric resonator 20 normally is mounted with eutectic layers 25 placed atop the corresponding eutectic layers 16 of pedestals 13. By heating the structure to above the eutectic temperature, then cooling, the material of layers 25 and 16 becomes eutectically fused, permanently mounting piezoelectric resonator 20. Note that as mounted, electrodes **22*a*, 22*b*, 22*c*, and 22*d* are on the side of piezoelectric wafer 21 facing substrate 10. The resultant microresonator structure exhibits the cross-sectional configuration illustrated in FIGURE 2. Evident in FIGURE 2 are substrate 10, electrical conductors 15, metallic support portions 14 and members 24, electrodes 22*a* and 22*b*, gap 23*a*, and piezoelectric wafer 21 including beam portion 21*a* and support arms 21*b*. Note that the fusion of eutectic regions 16 and 25 has resulted in a single eutectic bond region 27**.

In a preferred embodiment, piezoelectric resonator 20 is adapted to vibrate in the free-free flexure mode. In this mode beam **21*a*, when viewed from its side, appears to bend like a bow, the central beam portion bending upward above the plane of support arms 21*b* while the projection portions 21*a'* of beam 21 bend downward with respect to the plane of arms 21*b*. On alternative half cycles of the flexural vibration of resonator 20, beam extensions 21*a'* flex upward, while the central region of beam 21*a* bends downward. It will be appreciated that arms 21*b* extend from beam 21*a*** at the nodal points of this free-free flexural mode.

To achieve the preferred free-free flexural mode of vibration, it is desirable that piezoelectric wafer **21*a* have an appropriate crystalline orientation such that an electric field applied perpendicular to the length of beam 21*a* will introduce a strain longitudinal of beam 21*a*. This may be achieved, for example, by using a piezoelectric wafer of the trigonal holoaxial classification. Piezoelectric coefficient for such a trigonal holoaxial crystal are listed in the text book entitled "Piezoelectricity" by Walter Guyton Cady, Dover Edition, 1964, page 191. For such a material, wafer 21 comprises a Z-cut crystal having its Z' axis (the line normal to the plane of the wafer) rotated about the X-axis by approximately 5 degrees. (A discussion of piezoelectric crystal cuts is set forth in the "Handbook of Piezoelectric Crystals for Radio Equipment Designers" by John T. Buchanan, published by Wright Air Development Center, ASTIA Document No. AD110448, beginning at page 18.) Using this cut, beam 21***a* is oriented so that its length is perpendicular to the crystallographic X-axis, and a normal to the plane of wafer 21 is parallel to the Z′ axis as defined above. With this orientation, an electric field applied in the plane of wafer 21, but perpendicular to the length of beam 21*a*, will introduce a stress component longitudinal of beam 21*a* (resulting from the piezoelectric coefficient $-e_{11}$) and a second stress component parallel to the direction of the electric field (resulting from the $e_{11}$ piezoelectric coefficient).

It will be appreciated that when a voltage is applied between electrodes 22*a* and 22*b*, an electric field is generated therebetween, a portion of the electric field being within and transverse of beam 21*a*. This electric field causes piezoelectric stress components to be generated within beam 21*a* longitudinal and transverse thereof. Moreover, since electrodes 22*a* and 22*b* are disposed on one surface only of beam 21*a*, there will be an electrical field gradient within beam 21*a*, the electric field being strongest adjacent surface 28*a* to which electrodes 22*a* and 22*b* are attached, and weakest adjacent surface 28*b* on the opposite side of beam 21*a*. Thus, the longitudinal stress induced in beam 21*a* will be strongest adjacent surface 28*a*, and weakest adjacent 28*b*. The result of this longitudinal stress gradient is that beam 21*a* will vibrate in flexure. The induced stress component parallel to the electric field (i.e., perpendicular to the length of beam 21*a*) will enhance this flexure.

If the input signal applied across electrodes 22*a* and 22*b* corresponds in frequency to the natural flexure frequency of beam 21*a*, piezoelectric microresonator 20 will mechanically oscillate in the free-free flexural mode at its natural frequency. Since stressing of a piezoelectric material results in an electric field in the material perpendicular to the stress, an electric field will be induced between electrodes 22*c* and 22*d*. The frequency of the resultant output signal derivable across electrodes 22*c* and 22*d* corresponds to the natural flexural frequency of beam 21*a*. Thus, the inventive piezoelectric microresonator 20 may serve as a mechanical filter; when an input signal applied across electrodes 22*a* and 22*b* corresponds to the flexural mode vibration frequency of beam 21*a*, an output voltage at the same frequency is obtained across electrodes 22*c* and 22*d*.

In some applications resonator 20 may be used as a frequency standard rather than as a filter. Thus, if electrodes 22*a* and 22*c* are electrically connected. Inventive resonator 20 may be used as a two terminal frequency standard, as for example in a conventional crystal oscillator circuit.

Fabrication of beam 21*a* and arms 21*b* from a unitary wafer of piezoelectric material preferably is accomplished by etching, using appropriate photolithographic masks to achieve the desired dimension and shape. Such techniques are well known to those skilled in the art, and may include coating an appropriately oriented piezoelectric wafer with a photoresist such as Kodak KPR, exposing the photoresist through a mask defining the shape of resonator 20, removing the unexposed maskant, and etching away the regions of the piezoelectric wafer not covered by the exposed KPR. Alternatively, other milling techniques such as abrasion or ultrasonic milling may be used to prepare resonator wafer 21. Since the width of beam 21*a* and of arms 21*b* may be very small, it may be desirable to mount the piezoelectric wafer on the substrate atop the support pedestals prior to accomplishing the actual etching or milling. Should this be done, a drop of wax may be drawn by capiliary action between the unmilled wafer and the substrate, the wax protecting the underside of the wafer and the substrate from the action of the etchant. Of course, any residual wax is cleaned from the structure subsequent to etching or milling.

Figure 3:
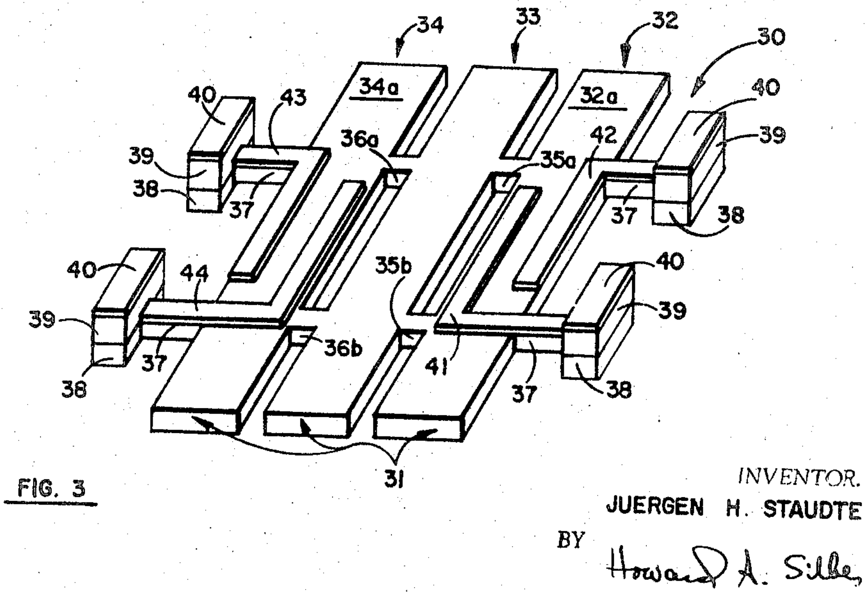
FIGURE 3 is a greatly enlarged perspective view of another embodiment of the inventive piezoelectric microresonator; this embodiment includes a plurality of coupled beams, and may exhibit broadband response.

Referring now to FIGURE 3, there is shown an alternative embodiment of the inventive piezoelectric resonator, this embodiment having, if desired, broadband response. As illustrated in FIGURE 3, broadband piezoelectric microresonator 30 comprises a unitary piezoelectric wafer 31 appropriately etched to form three beams 32, 33, and 34. Beams 32 and 33 are interconnected at their nodal points by coupling members 35*a* and 35*b*. Similarly, beams 33 and 34 are interconnected at their nodal points by coupling members 36*a* and 36*b*. Extending perpendicularly from nodal points of beams 32 and 34 are support arms 37 (analogous to support arms 21*b* of the embodiment of FIGURE 1). Beams 32, 33 and 34, coupling members 35*a*, 35 *b*, 36*a* and 36*b*, and support arms 37 are all fashioned from a unitary wafer of piezoelectric material.

Still referring to FIGURE 3, note that support arms 37 each terminate in an enlarged portion 38 disposed atop which is a metallic pedestal portion 39 (analogous to portion 24 in the embodiment of FIGURE 1). A layer 40 of eutectic material is provided atop each of support members 39.

A first set of close spaced, longitudinal, thin film metal electrodes 41 and 42 are provided in parallel relation atop one surface 32*a* of beam 32. Similarly, a second set of thin film metal electrodes 43 and 44 are provided longitudinally, in close spaced, parallel relationship atop a surface 34*a* of beam 34. Of course, microresonator 30 is mounted atop pedestals extending from a substrate in a manner analogous to resonator 20.

When an input signal is applied across electrodes 41 and 42, beam 32 will vibrate in the free-free flexural mode at its resonant frequency. Energy will be coupled via coupling members 35*a* and 35*b* to beam 33, which in turn will vibrate in flexure. Similarly, energy transmitted via coupling members 36*a* and 36*b* will cause beam 34 to vibrate in flexure, and to piezoelectrically induce an output signal across electrodes 43 and 44. (Alternatively, electrodes 43 and 44 may serve as the input, electrodes 41 and 42 as the output.) But appropriately fashioning beams 32, 33 and 34 so that their resonant frequencies are close, but not identical, broadband frequency may be obtained.

It will be apparent that various modification may be incorporated without departing from the spirit of this invention. For example, while both sets of electrodes are illustrated in FIGURE 1 as being on the same side of the piezoelectric beam, this is not required. The second set may be deleted entirely, or may be disposed on the opposite surface of the beam.

While the examples of the inventive microresonator illustrated employ the free-free flexure mode, the invention is not so limited, and other vibrational modes, such as the clamped-free or the clamped-clamped mode. Thus an embodiment of the invention may utilize a mounting pedestal at one end, or alternative at both ends, of a piezoelectric beam, the beam then vibrating respectively in the clamped-free or clamped-clamped mode. In either case, parallel elongate thin-film electrodes disposed on a surface of the beam are employed.

Although the invention has been described and illustrated in detail, it is to be clearly understood that the same is by way of illustration and example only and is not to be taken by way of limitation, the spirit and scope of this invention being limited only by the terms of the appended claims.

I claim:

1. A resonator adapted for microelectronic application, said resonator comprising:

a beam having support arms projecting perpendicularly from the vibrational nodal points thereof, said beam and said arms being fashioned from a unitary wafer of piezoelectrical material, means for supporting the extremities of said arms above a substrate, and means, comprising thin film electrodes disposed on said beam, for providing in said beam an electric field oriented to produce stress resulting in flexural mode vibration of said beam.

2. A resonator as defined in claim 1 wherein said electrodes are dispoesd in spaced parallel relationship on one surface of said beam.

3. A resonator as defined in claim 1 wherein said piezoelectric material exhibits stress longitudinal of said beam in response to an electric field transverse of said beam.

4. A resonator as defined in claim 3 wherein said electrodes are disposed on one surface of said beam, in close spaced parallel relationship longitudinal of said beam.

5. A resonator as defined in claim 4 wherein said piezoelectric material is of the triclinic holoaxial class.

6. A resonator as defined in claim 5 wherein said piezoelectric material is Z-cut, the Z′ axis of said material being rotated approximately 5° about the X axis.

7. A resonator as defined in claim 6 wherein the length of said beam is perpendicular to the X axis of said material and wherein said Z′ axis is normal to said beam.

8. A resonator as defined in claim 2 wherein said support means comprises:

a first set of metallic pedestals disposed on said substrate, a second set of metallic pedestals disposed on said extremities of said arms, said pedestals of said first set being bonded to said pedestals of said second set.

9. A resonator as defined in claim 8 wherein said bonding is eutectic.

10. A resonator as defined in claim 4 wherein said support means comprises:

a first set of metallic pedestals disposed on said substrate, a second set of metallic pedestals disposed on said extremities of said arms, said pedestals of said first being bonded to said pedestals of said second set.

11. A resonator as defined in claim 10 wherein electrical connection to said electrodes is provided via said pedestals.

12. A resonator as defined in claim 11, said resonator further comprising a second set of close spaced parallel thin film electrodes disposed on a surface of said beam longitudinally thereof, an output signal being piezoelectrically derived across said second set of electrodes in response to vibration of said beam.

13. A resonator as defined in claim 7 wherein said vibration is in the free-free flexural mode.

14. A resonator as defined in claim 11 wherein said resonator comprises a plurality of said beams, said beams being connected at their nodal points by coupling members, said beams, said coupling members and said arms all being fashioned from a unitary wafer of piezoelectric material.

15. A resonator as defined in claim 11 wherein said electrodes are disposed on one of said beams, longitudinally thereof, and further comprising a second set of thin film, close spaced parallel electrodes longitudinally disposed on one surface of another of said plurality of beams.

16. A resonator as defined in claim 8 wherein said substrate comprises a microelectronic integrated circuit.

17. A piezoelectric resonator comprising a beam of piezoelectric material supported on electrically conducting pedestals above a microelectronic substrate, a close-parallel pair of thin film metallic electrodes disposed longitudinally on one surface of said beam, electrical connections to said electrodes being via said pedestals, said beam being supported at its nodal points.

18. A resonator as defined in claim 17 wherein said pedestals are situated at an end of said beam, whereby said beam is adapted for vibration in a clamped mode.

References Cited

UNITED STATES PATENTS

| | | | |
|---|---|---|---|
| 3,209,178 | 9/1965 | Koneval | 333—72 |
| 3,264,585 | 8/1966 | Poschenkieder | 333—72 |
| 3,417,322 | 12/1968 | Fenner | 310—8.5 |
| 3,441,753 | 4/1969 | Terayama | 310—8.7 |
| 3,435,260 | 3/1969 | Seidel | 310—8.5 |

J D MILLER, Primary Examiner

U.S. Cl. X.R.

310—8, 8.5; 333—72